(12) United States Patent
Kao et al.

(10) Patent No.: US 9,982,343 B2
(45) Date of Patent: May 29, 2018

(54) APPARATUS FOR PROVIDING PLASMA TO A PROCESS CHAMBER

(71) Applicant: APPLIED MATERIALS, INC., Santa Clara, CA (US)

(72) Inventors: Chien-Teh Kao, Sunnyvale, CA (US); Hyman W. H. Lam, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 552 days.

(21) Appl. No.: 13/715,295

(22) Filed: Dec. 14, 2012

(65) Prior Publication Data

US 2014/0165912 A1 Jun. 19, 2014

(51) Int. Cl.
*C23C 16/00* (2006.01)
*H01L 21/00* (2006.01)
*C23C 16/455* (2006.01)
*H01J 37/32* (2006.01)
(Continued)

(52) U.S. Cl.
CPC ........ *C23C 16/455* (2013.01); *C23C 16/4408* (2013.01); *C23C 16/45565* (2013.01); *C23C 16/45574* (2013.01); *H01J 37/3244* (2013.01); *H01J 37/32357* (2013.01); *H01J 37/32449* (2013.01); *C23C 16/5096* (2013.01)

(58) Field of Classification Search
None
See application file for complete search history.

(56) References Cited

U.S. PATENT DOCUMENTS 7,658,799 B2 * 2/2010 Ishikawa ........... C23C 16/45565
118/715
8,366,828 B2 * 2/2013 Iizuka ................. C23C 16/4412
118/715
(Continued)

FOREIGN PATENT DOCUMENTS

JP 2011222991 11/2011
KR 101118997 B1 3/2012

OTHER PUBLICATIONS

International Search Report and Written Opinion dated Mar. 24, 2014 for PCT Application No. PCT/US2013/072430.

*Primary Examiner* — Parviz Hassanzadeh
*Assistant Examiner* — Michelle Crowell
(74) *Attorney, Agent, or Firm* — Moser Taboada; Alan Taboada

(57) ABSTRACT

Apparatus for providing plasma to a process chamber may include an electrode; a first ground plate disposed beneath the electrode defining a cavity therebetween; an insulator disposed between the electrode and first ground plate to prevent direct contact therebetween; a second ground plate disposed beneath the first ground plate defining a first channel; a plurality of first through holes through the first ground plate to fluidly couple the channel and cavity; a first gas inlet coupled to the first channel; a third ground plate disposed beneath the second ground plate defining a second channel; a plurality of conduits through the ground plates to fluidly couple the cavity to an area beneath the third ground plate; a plurality of gas outlet holes through the third ground plate to fluidly couple the second channel to the area beneath the third ground plate; and a second gas inlet coupled to the second channel.

19 Claims, 4 Drawing Sheets

(51) Int. Cl.
*C23C 16/44* (2006.01)
*C23C 16/509* (2006.01)

(56) References Cited

U.S. PATENT DOCUMENTS

| | | | |
|---|---|---|---|
| 8,852,387 B2* | 10/2014 | Iizuka | C23F 1/08 |
| | | | 118/715 |
| 2002/0129769 A1* | 9/2002 | Kim et al. | 118/723 E |
| 2003/0143328 A1* | 7/2003 | Chen | C23C 16/06 |
| | | | 427/255.28 |
| 2004/0194890 A1 | 10/2004 | Moroz | |
| 2005/0205110 A1* | 9/2005 | Kao et al. | 134/1.1 |
| 2005/0217576 A1* | 10/2005 | Ishibashi | C23C 16/452 |
| | | | 118/715 |
| 2005/0217582 A1* | 10/2005 | Kim | C23C 16/45514 |
| | | | 118/723 E |
| 2006/0234514 A1* | 10/2006 | Gianoulakis | C23C 16/4412 |
| | | | 438/758 |
| 2009/0126629 A1* | 5/2009 | Kumagai | C23C 16/452 |
| | | | 118/708 |
| 2009/0139453 A1* | 6/2009 | Chen et al. | 118/723 I |
| 2011/0048325 A1* | 3/2011 | Choi et al. | 118/712 |
| 2011/0052833 A1* | 3/2011 | Hanawa | C23C 16/4404 |
| | | | 427/534 |
| 2011/0265721 A1* | 11/2011 | Kao et al. | 118/723 E |
| 2011/0315320 A1 | 12/2011 | Do et al. | |
| 2012/0067971 A1* | 3/2012 | Byun | C23C 16/45565 |
| | | | 239/106 |
| 2012/0234945 A1* | 9/2012 | Olgado | 239/589 |
| 2012/0255678 A1 | 10/2012 | Holland et al. | |
| 2014/0165911 A1* | 6/2014 | Kao et al. | 118/723 E |

* cited by examiner

APPARATUS FOR PROVIDING PLASMA TO A PROCESS CHAMBER

FIELD

Embodiments of the present invention generally relate to semiconductor processing equipment.

BACKGROUND

Conventional substrate process chambers often utilize a plasma source having one or more electrodes configured to form a plasma from a process gas. Conventional plasma sources often mix the process gases and/or plasmas prior to distribution into the process chamber. However, the inventors have observed that such mixing of the process gases make the plasma source incompatible for deposition processes that require process gases to be provided to the process chamber separately and independently, such as cyclical deposition processes, for example, atomic layer deposition (ALD).

Therefore, the inventor has provided embodiments of an improved apparatus for providing plasma to a process chamber.

SUMMARY

Embodiments of apparatus for providing plasma to a process chamber are provided herein. In some embodiments, an apparatus for providing a plasma to a process chamber may include an electrode; a first ground plate disposed beneath and spaced apart from the electrode to define a cavity between the electrode and the first ground plate; an electrical insulator disposed between the electrode and the first ground plate to prevent direct contact between the electrode and the first ground plate; a second ground plate disposed beneath and spaced apart from the first ground plate to define a first channel between the first and second ground plates; a plurality of first through holes disposed through the first ground plate to fluidly couple the channel to the cavity; a first gas inlet coupled to the first channel; a third ground plate disposed beneath and spaced apart from the second ground plate to define a second channel between the second ground plate and the third ground plate; a plurality of conduits disposed through the first, second, and third ground plates to fluidly couple the cavity to an area beneath the third ground plate; a plurality of gas outlet holes disposed through the third ground plate to fluidly couple the second channel to the area beneath the third ground plate; and a second gas inlet coupled to the second channel.

In some embodiments, a process chamber lid having an integrated apparatus for providing a plasma to the process chamber is provided, wherein the integrated apparatus for providing a plasma may include an electrode; a first ground plate disposed beneath and spaced apart from the electrode to define a cavity between the electrode and the first ground plate; an electrical insulator disposed between the electrode and the first ground plate to prevent direct contact between the electrode and the first ground plate; a second ground plate disposed beneath and spaced apart from the first ground plate to define a first channel between the first and second ground plates; a plurality of first through holes disposed through the first ground plate to fluidly couple the channel to the cavity; a first gas inlet coupled to the first channel; a first outlet coupled to the first channel; a third ground plate disposed beneath and spaced apart from the second ground plate to form a second channel between the second ground plate and the third ground plate; a plurality of conduits disposed through the first, second, and third ground plates to fluidly couple the cavity to an area beneath the third ground plate; a plurality of gas outlet holes disposed through the third ground plate to fluidly couple the second channel to the area beneath the third ground plate; a second gas inlet coupled to the second channel; a second outlet coupled to the second channel; and at least one of: a ring disposed in the first channel and defining a plenum between the plurality of through holes and the first gas inlet, wherein the ring has a plurality of through holes that fluidly couple the plenum to the plurality of through holes; or a ring disposed in the second channel and defining a plenum between the plurality of gas outlet holes and the second gas inlet, wherein the ring has a plurality of through holes that fluidly couple the plenum to the plurality of gas outlet holes.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
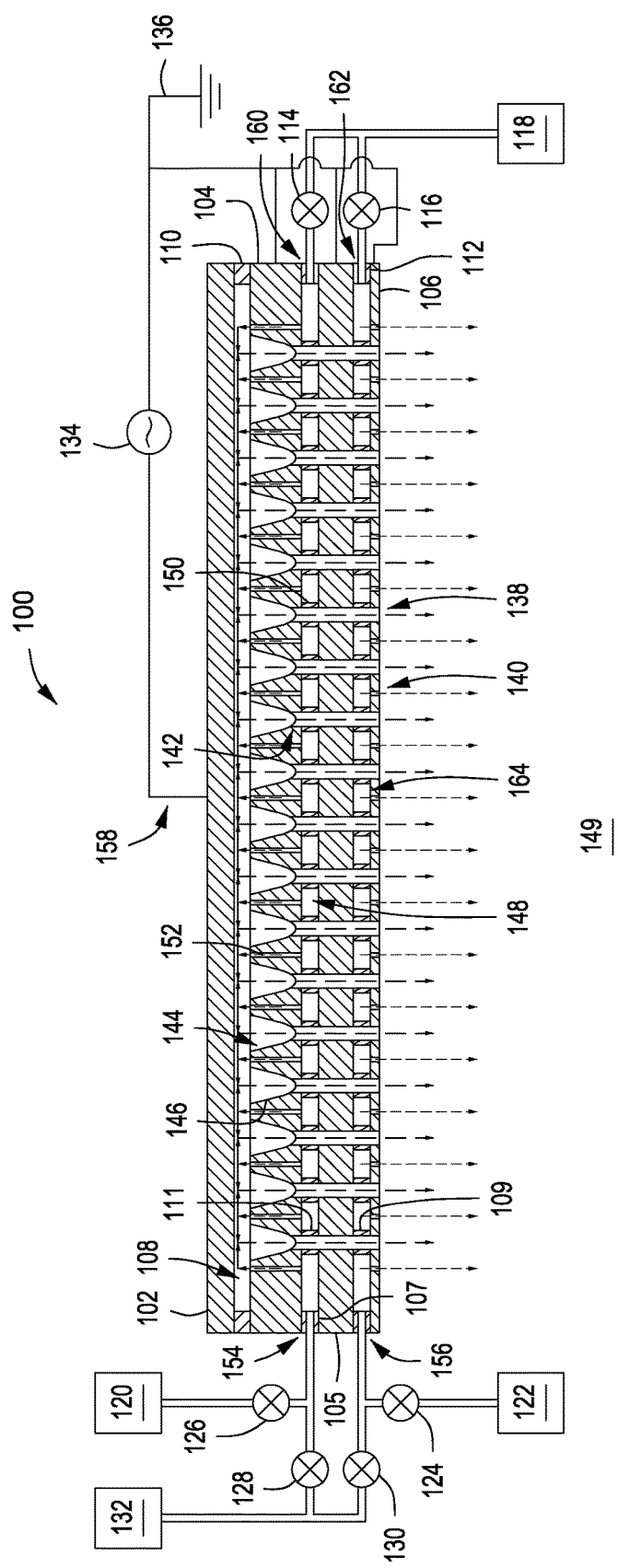
FIG. 1 depicts a schematic side view of an apparatus for providing a plasma to a process chamber in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of an apparatus for providing plasma to a process chamber that may facilitate the separate and independent provision of gases and/or plasma to a process chamber are provided herein.

Referring to FIG. 1, in some embodiments, the apparatus (plasma source) 100 for providing a plasma to a process chamber may generally comprise an electrode 102, a first ground plate 104 disposed beneath and spaced apart from the electrode 102, a second ground plate 105 disposed beneath the first ground plate 104, and a third ground plate 106 disposed beneath the second ground plate 104. The first ground plate 104, the second ground plate 105, and the third ground plate 106 are coupled to ground, for example common ground 136, either directly or indirectly (for example via coupling through another grounded element). A cavity 108 is disposed between the electrode 102 and the first ground plate 104. A first channel is disposed between the first and second ground plates 104, 105. A second channel 164 is disposed between the second and third ground plates 105, 106.

The first ground plate 104, second ground plate 105, third ground plate 106, and electrode 102 may be fabricated from any process compatible conductive material. For example, in some embodiments, the first ground plate 104, second ground plate 105, third ground plate 106, and electrode 102 may be fabricated from a metal or metal alloy, for example, such as aluminum, nickel coated aluminum, steel, stainless steel, iron, nickel, chromium, alloys thereof, combinations thereof, or the like. Each of the first ground plate 104, second ground plate 105, third ground plate 106, and electrode 102 may be fabricated from the same material, or in some embodiments, different materials.

A capacitively coupled plasma cavity is integrated within the apparatus 100 and positioned at the top of the apparatus 100. The capacitively coupled plasma cavity is formed by a top electrode (e.g., an anode) and a bottom electrode (e.g., a cathode), separated by insulating spacer, such as a ceramic spacer. For example, as depicted in FIG. 1, an electrical insulator 110 (e.g., an insulating spacer) is disposed between the electrode 102 and the first ground plate 104 to form a cavity 108 between the electrode 102 and the first ground plate 104. The electrical insulator 110 may be a ring disposed between a periphery of the electrode 102 and the first ground plate 104 to define the cavity 108 and prevent leakage of gases from the cavity 108 along the edges of the electrode 102 and the first ground plate 104. One or more process compatible seals (not shown), such as o-rings or other gasketing material, may be disposed between the electrical insulator 110 and the electrode 102 and/or the first ground plate 104. The cavity 108 provides a cavity where a first gas (e.g., a first process gas) may be provided to allow for the ignition of the gas to form a plasma. The electrical insulator 110 electrically isolates the electrode 102 from the first ground plate 104. The electrical insulator 110 may be fabricated from any process compatible electrically insulating material, for example, such as quartz ($SiO_2$), a sintered ceramic such as aluminum oxide ($Al_2O_3$) or silicon nitride (SiN), or a single crystal sapphire ($Al_2O_3$).

In some embodiments, a power supply 134 may be coupled to the electrode 102 to provide power to the electrode 102 to facilitate ignition of the gas to form the plasma. The power supply 134 may any type of power supply suitable to provide sufficient power to ignite the gas, for example such as DC, AC, or RF power supply or the like. In some embodiments, the power supply 134 may be an AC power supply that provides power at a frequency range of about 50 Hz to about 300 GHz. In some embodiments, the power supply 134 may be operated in a continuous or pulsed mode. The inventors have observed that providing the electrode 102 above the first ground plate 104, second ground plate 105, and third ground plate 106 facilitates ease of coupling of the power supply 134 to the electrode proximate a center 158 of the electrode 102. Coupling the power supply 134 to the electrode proximate a center of the electrode 102 provides more symmetrical and uniform power distribution across the electrode 102 as compared to coupling the power supply to an edge of the electrode.

A first channel 148 is disposed between the first ground plate 104 and the second ground plate 105. For example, in some embodiments, a spacer 107 may be provided between the first and second ground plates 104, 105 to define the first channel 148. The spacer 107 may be a ring disposed between a periphery of the first ground plate 104 and the second ground plate 105 to define the first channel 148 and to prevent leakage of gases from the first channel 148 along the edges of the first ground plate 104 and the second ground plate 105. The spacer 107 may be an integral part of the first ground plate 104 or the second ground plate 105, or may be a separate component. One or more process compatible seals (not shown), such as o-rings or other gasketing material, may be disposed between the ring 107 and the first and/or second ground plate 104, 105.

The first channel 148 may include a first gas inlet 154 to allow the first gas to be provided to the first channel 148 from, for example, a gas supply (first gas supply 120 and second gas supply 132 shown). The inventors have observed that, because the first and second ground plates 104, 105 are electrically isolated from the electrode 102 and grounded, an electrical potential at the first gas inlet 154 is greatly reduced or eliminated, thereby reducing or eliminating undesirable potential electrical arcing and/or the formation of a parasitic plasma proximate the gas inlet 154. By eliminating the electrical arcing and the formation of the parasitic plasma, plasma induced damage to the plasma source and particle formation may advantageously be reduced or eliminated.

A valve 126 is disposed between the first gas supply 120 and the first gas inlet 154 and a valve 128 is disposed between the second gas supply 132 and the first gas inlet 154. Valves 126, 128 allow gases from each of the first gas supply 120 and the second gas supply 132 to be selectively provided to the first channel 148. Each of the first gas supply 120 and the second gas supply 132 may be configured to provide any type of gas suitable to perform a desired process. For example, in some embodiments, the first gas supply 120 may be configured to provide a reactant gas to be formed into the plasma and the second gas supply 132 may be configured to provide, for example, a purge or dilutant gas.

In some embodiments, the first channel 148 may include a first outlet 160 to allow the first channel 148 to be evacuated via, for example, a vacuum pump 118. In some embodiments, a valve 114 may be disposed between the first outlet 160 and the vacuum pump 118 to allow the first channel 148 to be selectively sealed and isolated from the vacuum pump. In some embodiments, the first outlet 160 and vacuum pump 118 may be utilized to purge the first channel 148. For example, an inert gas from a gas supply (e.g., the second gas supply 132) may be provided to the first channel 148 via the first gas inlet 154 while providing a vacuum force from the vacuum pump 118 via the first outlet 160, thereby providing a flow of the inert gas from the inlet to the first outlet 160 and through the first channel 148 to facilitate purging the first channel 148.

A plurality of first through holes 152 may be disposed through a portion of the first ground plate 104 to fluidly couple the first channel 148 to the cavity 108. The plurality of first through holes 152 facilitate the delivery of one or more gases provided from the first gas supply 120 or the second gas supply 132 from the first channel 148 to the cavity 108. Thus, the channel is an enclosed volume that is directly fluidly coupled only to the cavity 108 and selectively coupled to one or more gas supplies (e.g., first and second gas supplies 120, 132) and, optionally, a vacuum source (e.g., vacuum pump 118).

A plurality of second through holes 142 may be disposed through a portion of the first ground plate 104 to fluidly couple the cavity 108 to an area (processing volume 149) beneath the third ground plate 106. A plurality of conduits 150 are disposed between the first ground plate 104 and the third ground plate 106 to couple the plurality of second through holes 142 to a plurality of first gas outlet holes 138 of the third ground plate 106 to facilitate the distribution of the gas and/or plasma to the processing volume 149.

In some embodiments, the plurality of conduits 150 may be formed in the second ground plate 105. Alternatively, in some embodiments, each of the plurality of conduits 150 may be a conduit that is coupled to or disposed through a portion of the first ground plate 104 and that extends into the first channel 148, through the second ground plate 105, and into a second channel 164 (discussed below) to couple the plurality of second through holes 142 to a plurality of first gas outlet holes 138 of the third ground plate 106. Alternatively, in some embodiments, each of the plurality of conduits 150 may comprise a first conduit 111 disposed within the first channel 148 and a second conduit 109 disposed between the first ground plate 104 and the third ground plate 106. In such embodiments, the first conduit 111 and the second conduit 109 may be coupled to the first ground plate 104 and/or the third ground plate 106 via welding, brazing, or the like. Alternatively, the first conduits 111 may be part of the first or the second ground plates 104, 105. Similarly, the second conduits 109 may be part of the second or the third ground plates 105, 106.

In an exemplary operation, one or both of the gas supplies 120, 132 may provide one or more gases to the first channel 148. The gases flow upwards into the cavity 108 via the plurality of first through holes 152. RF energy is provided from the RF power source 134 and coupled to the gases via the electrode 102 to form a plasma. The activated species (or radicals) generated in the plasma then flows from the cavity 108 to the processing volume 149 via the plurality of second through holes 142, plurality of conduits 150 and plurality of first gas outlets 138 of the third ground plate 106.

In some embodiments, either or both of the electrode 102 or the first ground plate 104 may include uniformly distributed cone-shaped mini-cavities along surfaces facing the plasma cavity (e.g., the cavity 108). For example, in some embodiments, the plurality of second through holes 142 may have one or more conical shapes. For example, in some embodiments, each of the plurality of second through holes 142 may comprise an upper portion 146 having a conical shape, wherein the base 144 of the conical shape (i.e., the larger diameter portion) is facing towards the cavity 108. The inventors have observed that the conically shaped plurality of second through holes 142 may facilitate uniform ignition of the gas, thereby producing uniform plasma. In some embodiments, the conically shaped plurality of second through holes 142 may offset inconsistencies in the plasma ignition due to, for example, a non-uniform size of the cavity 108 due to the first ground plate 104 being non-parallel with the electrode 102. In addition, the inventors have observed that conically shaped plurality of second through holes 142 may facilitate ignition of a higher plasma density, thereby providing increased radical generation within the plasma.

Figure 2:
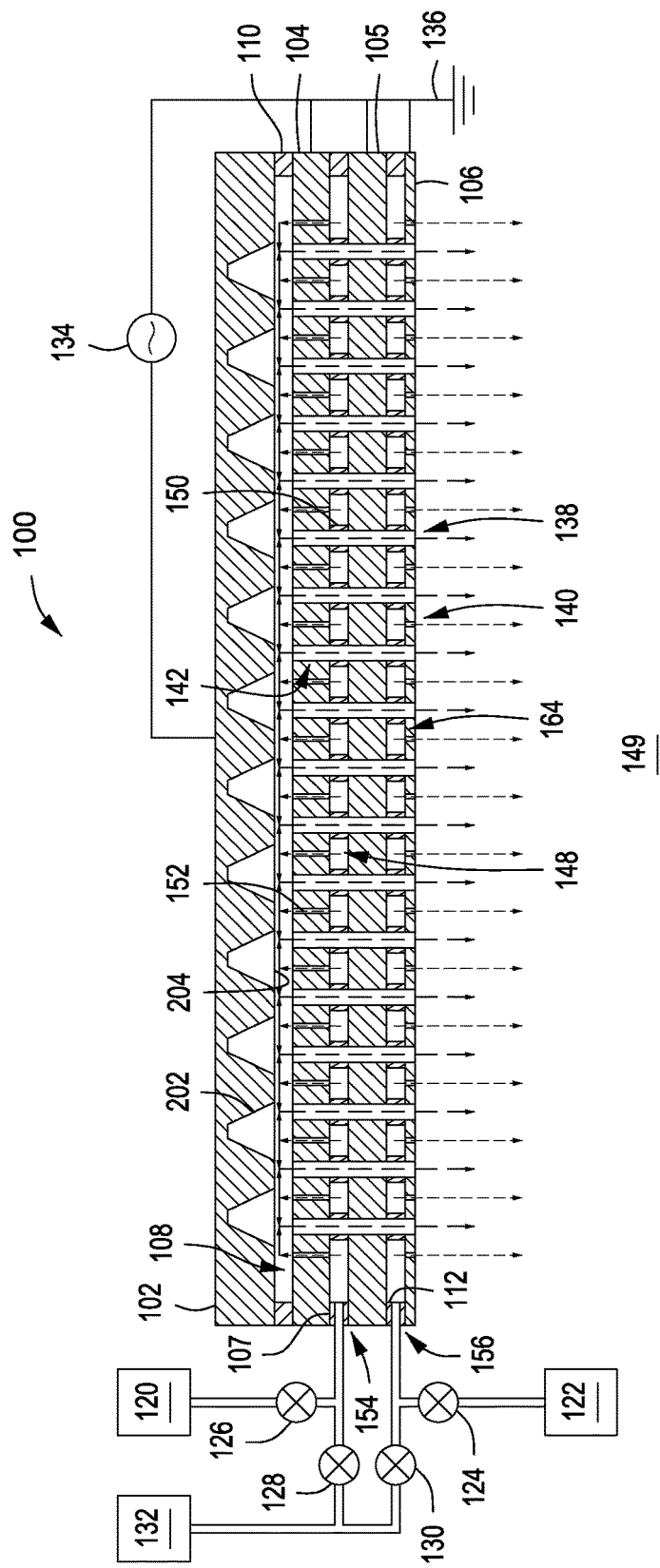
FIG. 2 depicts a schematic side view of an apparatus for providing a plasma to a process chamber in accordance with some embodiments of the present invention.

Alternatively, or in combination, in some embodiments, the electrode 102 may include a plurality of conically shaped cavities 202 disposed in an inner facing surface 204 of the electrode 102, for example, such as shown in FIG. 2. When present, the conically shaped cavities 202 perform the same function as the conically shaped plurality of second through holes 142, as described above. In some embodiments where the electrode 102 includes conically shaped cavities 202, the plurality of second through holes 142 of the first ground plate 104 may be cylindrical, such as shown in FIG. 2.

The inventors have observed that conventional plasma sources mix the gases and/or plasmas prior to distribution into the process chamber. Such mixing of the gases make the plasma source incompatible for deposition processes that require gases to be provided to the process chamber separately and independently, such as cyclical deposition processes, for example, atomic layer deposition (ALD). Accordingly, referring back to FIG. 1, in some embodiments, the plasma source 100 may comprise a spacer 112 disposed between the second ground plate 105 and the third ground plate 106 to form a second channel 164 between the second ground plate 105 and the third ground plate 106. The spacer 112 may be a ring disposed between a periphery of the second and third ground plates 105, 106 to define the second channel 164 and to prevent leakage of gases from the second channel 164 along the edges of the second and third ground plates 105, 106. The spacer 112 may be an integral part of the second or third ground plates 105, 106, or the spacer 112 may be a separate component. One or more process compatible seals (not shown), such as o-rings or other gasketing material, may be disposed between the spacer 112 and the second and/or third ground plates 105, 106.

The third ground plate 106 includes a plurality of second gas outlet holes 140 that fluidly couple the second channel 168 and the processing volume 149. When present, the second channel 164 and plurality of second gas outlet holes 140 allow a flow of a second gas (e.g., a second process gas) to the processing volume 149 that is separate and independent from a flow of the first gas via the cavity 108. By providing independent flow of gases through the cavity 108 and second channel 164, multiple gases may be provided to the processing volume 149 separately and without mixing and/or reacting prior to reaching the processing volume 149 (e.g., within the plasma source 100), thereby allowing the plasma source to be utilized in deposition processes that require gases to be provided to the process chamber separately and independently, such as cyclical deposition processes, for example, atomic layer deposition (ALD). Moreover, the gases provided to the second channel 164 are advantageously not energized sufficiently to form a plasma, thereby providing further flexibility in processing by allowing a mixture of plasma and non-plasma species within the processing volume.

The spacer 112 may be fabricated from any process compatible material, for example a conductive material, an insulative material, or the like. In some embodiments the spacer 112 is a separate component that is positioned between the second ground plate 105 and the third ground plate 106. Alternatively, in some embodiments, the spacer 112 may be a portion of the second ground plate 105 or of the third ground plate 106 that extends from a surface of the second ground plate 105 or the third ground plate 106.

In some embodiments, the second channel 164 includes a second gas inlet 156 to allow the second gas to be provided to the second channel 164 from, for example, a gas supply (the second gas supply 132 and third gas supply 122). In some embodiments, a valve 124, 130 may be disposed between the second gas supply 132 and the second gas inlet 156 and the third gas supply 122 and the second gas inlet 156 to allow gases from each of the second gas supply 132 and the third gas supply 122 to be selectively provided to the second channel 164. Each of the second gas supply 132 and the third gas supply 122 may be configured to provide any type of gas suitable to perform a desired process. For example, in some embodiments, the third gas supply 122 may be configured to provide a precursor gas and the second gas supply 132 may be configured to provide, for example, a purge or dilutant gas to the second channel 164.

In some embodiments, the second channel 164 may comprise a second outlet 162 to allow the second channel 164 to be evacuated via, for example, the vacuum pump 118. In some embodiments, a valve 116 may be disposed between the second outlet 162 and vacuum pump 118 to allow the second channel 164 to be selectively sealed and isolated from the vacuum pump 118. In some embodiments, the second outlet 162 and vacuum pump 118 may be utilized to purge the second channel 164, for example, such as described above with respect to purging the first channel 148.

Figure 3:
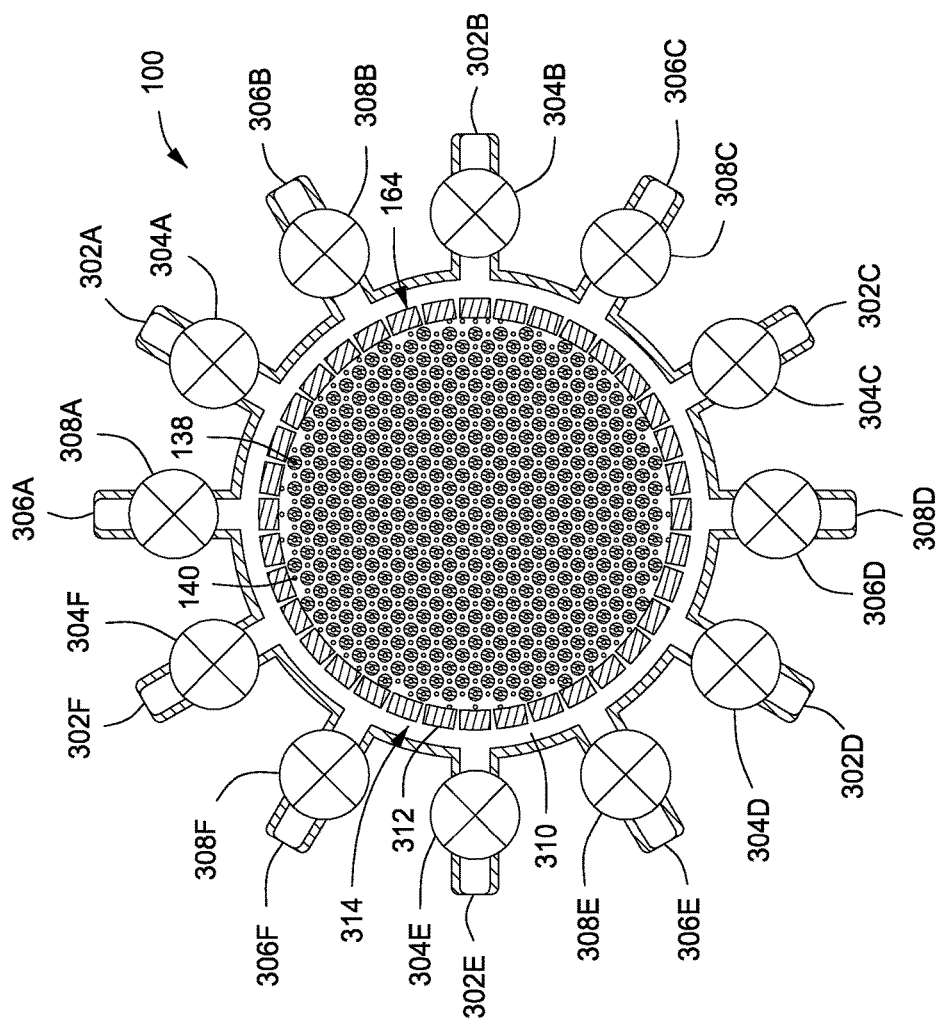
FIG. 3 depicts a schematic top view of an apparatus for providing a plasma to a process chamber in accordance with some embodiments of the present invention.

Referring to FIG. 3, in some embodiments, each of the first channel 148 or the second channel 164 may include multiple inlets and multiple outlets (e.g., inlets 154, 156 and outlets 160, 162) distributed about the plasma source 100 to facilitate uniform distribution of gases and a complete purging of the first channel 148 or the second channel 164. For example, in some embodiments, the second channel 164 may be coupled to a plurality of inlets 302A-F and a plurality of outlets 306A-F, as shown in FIG. 3. In such embodiments, each of the plurality of inlets 302A-F and plurality of outlets 306A-F may include a valve 304A-F, 308A-F to facilitate selective operation of each of the plurality of inlets 302A-F and plurality of outlets 306A-F. In some embodiments, a ring 312 having a plurality of through holes 314 may be disposed within the second channel 164 and about the first gas outlet holes 138 and second gas outlet holes 140. The ring 312 divides the second channel 164 into an inner portion containing the second gas outlet holes 140 and an outer portion forming a plenum 310 between the ring 312 and outer walls of the plasma source 100 (for example, the spacer 112) having the inlets and outlets (e.g., inlet 154 and outlet 160 or inlet 156 and outlet 162). For example, the ring 312 disposed in the second channel 164 defines the plenum 310 between the plurality of gas outlet holes 140 and the second gas inlet 156. The ring 310 has a plurality of through holes 314, or passageways, that fluidly couple the plenum 310 to the plurality of gas outlet holes 140.

The plenum 310 provided by the ring 312 facilitates uniform distribution and/or removal of the gases via the plurality of inlets 302A-F and plurality of outlets 306A-F. Although only the second channel 164 having one set of each of the plurality of inlets 302A-F, plurality of outlets 306A-F and the gas ring 312 are shown in FIG. 3, the first channel 148 may similarly comprise a plurality of inlets, a plurality of outlets and a ring as discussed above. For example, a ring may be disposed in the first channel 148 to define a plenum between the plurality of through holes 152 and the first gas inlet 154, wherein the ring has a plurality of through holes that fluidly couple the plenum to the plurality of through holes 152.

The plasma source 100 may be a standalone apparatus configured to produce a plasma that is subsequently provided to a process chamber (e.g., a remote plasma source), or in some embodiments, the plasma source 100 may be integrated into a process chamber. For example, the plasma source 100 may be integrated into a process chamber lid, for example such as shown in FIG. 4.

Figure 4:
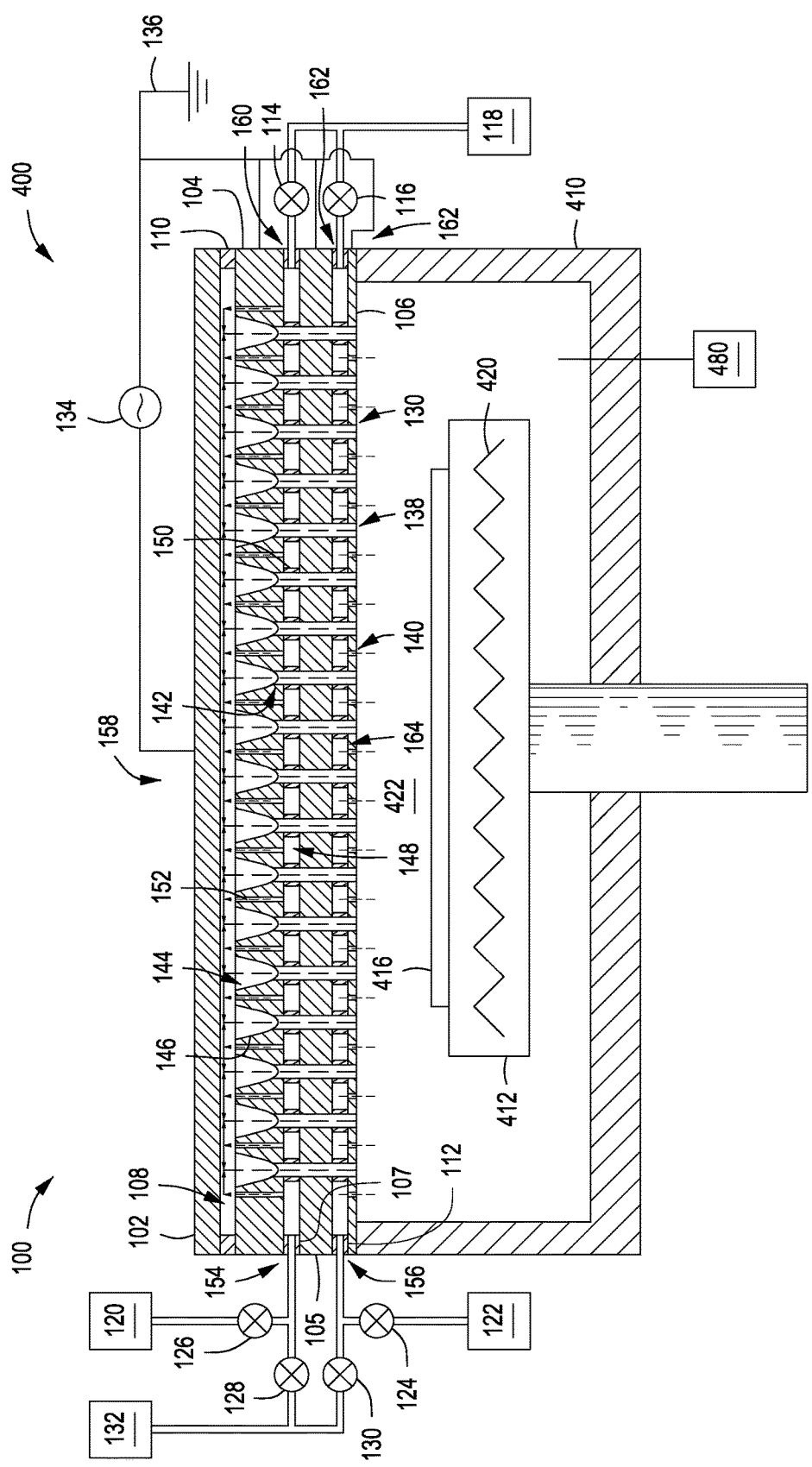
FIG. 4 depicts a process chamber suitable for use with an apparatus for providing a plasma to a process chamber in accordance with some embodiments of the present invention.

Referring to FIG. 4, the process chamber 400 may be any process chamber suitable for plasma enhanced semiconductor processing, for example, such as a process chamber configured to perform a plasma assisted chemical vapor deposition (CVD) or an atomic layer deposition (ALD) process. Exemplary process chambers may include the ENDURA®, PRODUCER® or CENTURA® platform process chambers, or other process chambers, available from Applied Materials, Inc. of Santa Clara, Calif. Other suitable process chambers may similarly be used.

In some embodiments, the process chamber 400 may generally comprise a chamber body 410 and a substrate support 412 disposed within the chamber body 410. In some embodiments, the inventive plasma source 100 is disposed atop the chamber body and is integrated with, or functions as, a chamber lid or a portion thereof.

The substrate support 412 is configured to support one or more substrates 416 in a processing volume 422 defined by the chamber body 410 and the plasma source 100 and/or process chamber lid. In some embodiments, the substrate support 412 may include a heater 420 and/or fluid cooling channels (not shown) adapted to control the temperature of the one or more substrates 416, to a temperature required by the process being performed.

In some embodiments, the process chamber 400 includes a vacuum pump 480 to pump out the processing volume 418 to obtain and/or maintain a desired pressure in the processing volume 418. During processing, the vacuum pump 480 provides a negative pressure in the processing volume 418 relative to the second channel 116 of the plasma source 100, thus allowing the species in the second channel 116 to flow to the processing volume 418.

Therefore, embodiments of an apparatus for providing plasma to a process chamber that may advantageously allow multiple gases and/or plasmas to be provided to the process chamber separately and independently.

While the foregoing is directed to embodiments of the present invention, other and further embodiments of the invention may be devised without departing from the basic scope thereof.

The invention claimed is:

1. An apparatus for providing a plasma to a process chamber, comprising:
   an electrode;
   a first ground plate disposed beneath and spaced apart from the electrode to define a cavity between the electrode and the first ground plate;
   an electrical insulator disposed between the electrode and the first ground plate to prevent direct contact between the electrode and the first ground plate, wherein the cavity is defined by the electrode, the first ground plate, and the electrical insulator;
   a second ground plate disposed beneath and spaced apart from the first ground plate to define a first channel between the first and second ground plates;
   a plurality of first through holes disposed through the first ground plate to fluidly couple the first channel to the cavity;
   a first gas inlet coupled to the first channel;
   a third ground plate disposed beneath and spaced apart from the second ground plate, wherein a second channel is defined by the second ground plate and the third ground plate;
   a plurality of conduits disposed through the first, second, and third ground plates to fluidly couple the cavity to an area beneath the third ground plate, wherein a first flow path is defined from the first gas inlet into the first channel, from the first channel through the plurality of first through holes into the cavity, and from the cavity through the plurality of conduits into the area beneath the third ground plate, wherein the plurality of conduits include a corresponding plurality of second through holes disposed though the first ground plate, and wherein each of the plurality of second through holes has a conically shaped upper portion with a larger diameter portion of the conically shaped upper portion disposed adjacent the cavity;
a plurality of gas outlet holes disposed through the third ground plate to fluidly couple the second channel to the area beneath the third ground plate; and
a second gas inlet coupled to the second channel, wherein a second flow path is defined from the second gas inlet into the second channel, and from the second channel through the plurality of gas outlet holes into the area beneath the third ground plate.

2. The apparatus of claim 1, wherein the first ground plate, the second ground plate, and the third ground plate are electrically coupled to a ground.

3. The apparatus of claim 1, wherein a surface of the electrode that faces the cavity has a plurality of conically shaped recesses at locations opposite the plurality of conduits.

4. The apparatus of claim 1, further comprising:
a first gas supply coupled to the first gas inlet to provide a first gas to the first channel.

5. The apparatus of claim 4, wherein the first gas is a reactant gas.

6. The apparatus of claim 1, further comprising:
a second supply source coupled to at least one of the first gas inlet or the second gas inlet to provide a second gas to the at least one of the first channel or the second channel.

7. The apparatus of claim 6, wherein the second gas is a precursor gas.

8. The apparatus of claim 1, further comprising:
a third gas supply coupled to the second gas inlet to provide a third gas to the second channel.

9. The apparatus of claim 8, wherein the third gas is a purge gas.

10. The apparatus of claim 1, further comprising:
a first outlet coupled to the first channel to evacuate the first channel; and
a second outlet coupled to the second channel to evacuate the second channel.

11. The apparatus of claim 10, wherein the first outlet and the second outlet are coupled to a vacuum pump.

12. The apparatus of claim 10, wherein the first outlet comprises a plurality of first outlets and the second outlet comprises a plurality of second outlets.

13. The apparatus of claim 1, further comprising at least one of:
a ring disposed in the first channel and defining a plenum between the plurality of through holes and the first gas inlet, wherein the ring has a plurality of through holes that fluidly couple the plenum to the plurality of through holes; or
a ring disposed in the second channel and defining a plenum between the plurality of gas outlet holes and the second gas inlet, wherein the ring has a plurality of through holes that fluidly couple the plenum to the plurality of gas outlet holes.

14. The apparatus of claim 1, further comprising:
a plurality of first inlets coupled to the first channel; and
a plurality of second inlets coupled to the second channel.

15. A process chamber lid having an integrated apparatus for providing a plasma to a process chamber, comprising:
an electrode;
a first ground plate disposed beneath and spaced apart from the electrode to define a cavity between the electrode and the first ground plate;
an electrical insulator disposed between the electrode and the first ground plate to prevent direct contact between the electrode and the first ground plate, wherein the cavity is defined by the electrode, the first ground plate, and the electrical insulator;
a second ground plate disposed beneath and spaced apart from the first ground plate to define a first channel between the first and second ground plates;
a plurality of first through holes disposed through the first ground plate to fluidly couple the first channel to the cavity;
a first gas inlet coupled to the first channel;
a first outlet coupled to the first channel;
a third ground plate disposed beneath and spaced apart from the second ground plate, wherein a second channel is defined by the second ground plate and the third ground plate;
a plurality of conduits disposed through the first, second, and third ground plates to fluidly couple the cavity to an area beneath the third ground plate, wherein a first flow path is defined from the first gas inlet into the first channel, from the first channel through the plurality of first through holes into the cavity, and from the cavity through the plurality of conduits into the area beneath the third ground plate, wherein the plurality of conduits include a corresponding plurality of second through holes disposed though the first ground plate, and wherein each of the plurality of second through holes has a conically shaped upper portion with a larger diameter portion of the conically shaped upper portion disposed adjacent the cavity;
a plurality of gas outlet holes disposed through the third ground plate to fluidly couple the second channel to the area beneath the third ground plate;
a second gas inlet coupled to the second channel, wherein a second flow path is defined from the second gas inlet into the second channel, and from the second channel through the plurality of gas outlet holes into the area beneath the third ground plate;
a second outlet coupled to the second channel; and at least one of:
a ring disposed in the first channel and defining a plenum between the plurality of through holes and the first gas inlet, wherein the ring has a plurality of through holes that fluidly couple the plenum to the plurality of through holes; or
a ring disposed in the second channel and defining a plenum between the plurality of gas outlet holes and the second gas inlet, wherein the ring has a plurality of through holes that fluidly couple the plenum to the plurality of gas outlet holes.

16. The process chamber lid of claim 15, wherein the plurality of first through holes of the first ground plate are conically shaped.

17. The process chamber lid of claim 15, wherein a surface of the electrode that faces the cavity has a plurality of conically shaped recesses at locations opposite the plurality of conduits.

18. The process chamber lid of claim 15, further comprising:
a plurality of first gas inlets coupled to the first channel;
a plurality of first outlets coupled to the first channel;
a plurality of second gas inlets coupled to the second channel; and
a plurality of second outlets coupled to the second channel.

19. The apparatus of claim 1, wherein the plurality of conduits extend through the first channel and the second channel.

\* \* \* \* \*